United States Patent [19]

Moe et al.

[11] Patent Number: 4,875,824
[45] Date of Patent: Oct. 24, 1989

[54] WAFER TRANSFER APPARATUS

[75] Inventors: Rolf Moe, Alameda; David J. Corriea, Hayward; John E. Premeau, Fremont, all of Calif.

[73] Assignee: Biorne Enterprises, Inc., Hayward, Calif.

[21] Appl. No.: 150,784

[22] Filed: Feb. 1, 1988

[51] Int. Cl.$^4$ .................. B65G 65/02; B65G 49/04
[52] U.S. Cl. .................. 414/751; 294/103.1; 198/468.2; 901/7; 901/8; 901/16
[58] Field of Search .................. 414/751, 741, 752; 901/16, 8, 7; 294/103.1; 198/468.2

[56] References Cited

U.S. PATENT DOCUMENTS

| | | | |
|---|---|---|---|
| 3,648,854 | 3/1972 | Potter | 414/751 |
| 3,884,363 | 5/1975 | Ajlouny | 414/751 X |
| 4,568,234 | 2/1986 | Lee et al. | 414/751 X |
| 4,648,786 | 3/1987 | Sakurai | 414/752 |

Primary Examiner—Robert J. Spar
Assistant Examiner—Donald W. Underwood
Attorney, Agent, or Firm—Julian Caplan

[57] ABSTRACT

Transfer mechanism to pick up an object such as a wafer used in the manufacture of semiconductor chips from one location, lift the object, transfer the same laterally, lower it and later deposit the same in another location. A horizontal feedscrew mounted in a stationary base controls horizontal reciprocation of a transverse housing. A vertical feedscrew mounted in the transverse housing controls vertical reciprocation of a second housing. Supported by the second housing are one or more lifts. Each lift has guide rods fixed relative to the second housing and a stop on its lower end. Parallel and adjacent the guide rods is a reciprocating rod carrying a gripper on its lower end. At the end of the vertical movement of the second housing the reciprocating rod moves the gripper away from the stop so that a wafer may rest on the guide rods. As the second housing moves up, the gripper clamps the wafer against the stop. Motors drive the feedscrews to lift the wafer, move it transversely and lower it. As it reaches the end of its lowering movement, the wafer is unclamped.

3 Claims, 8 Drawing Sheets

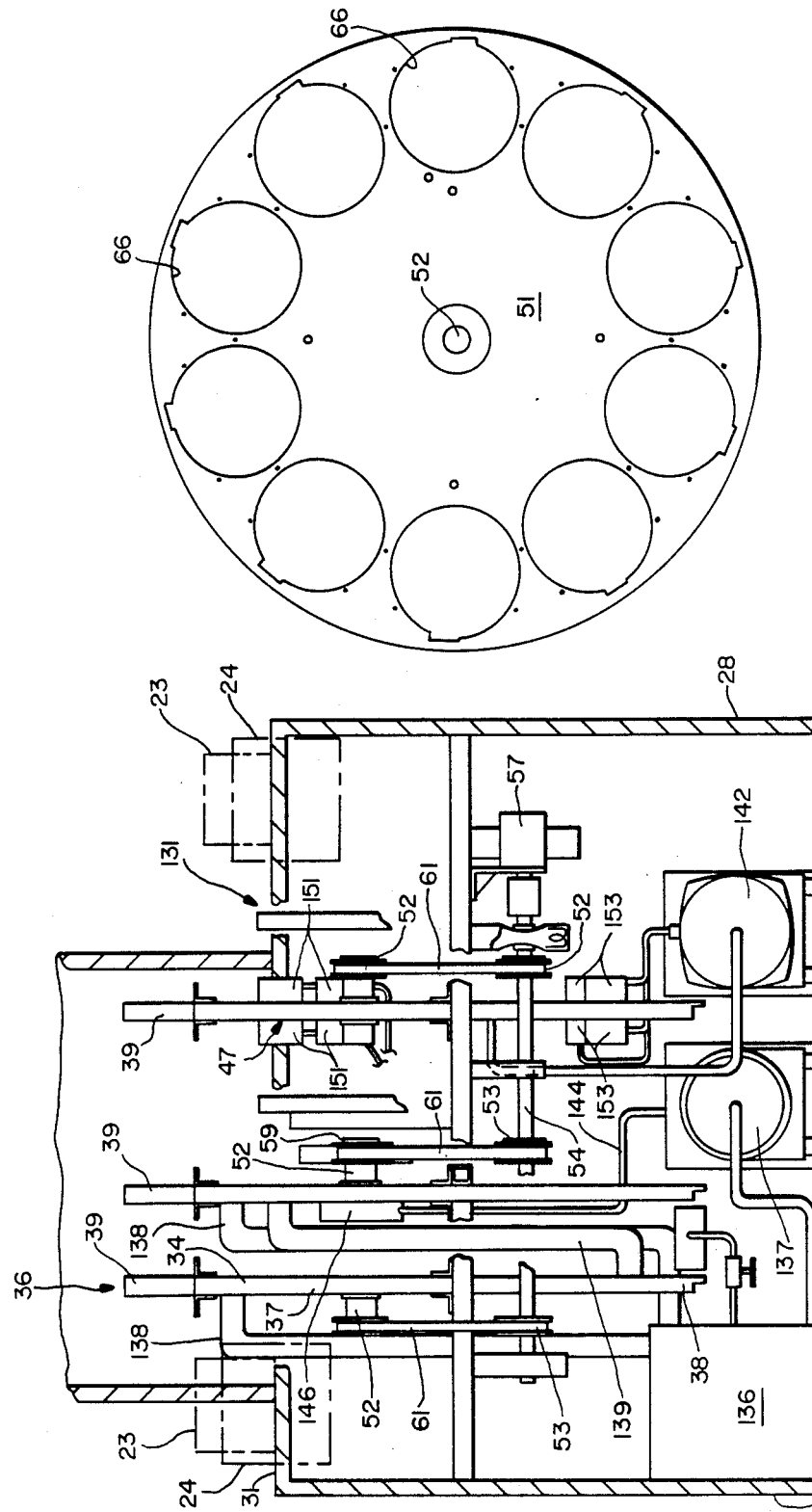

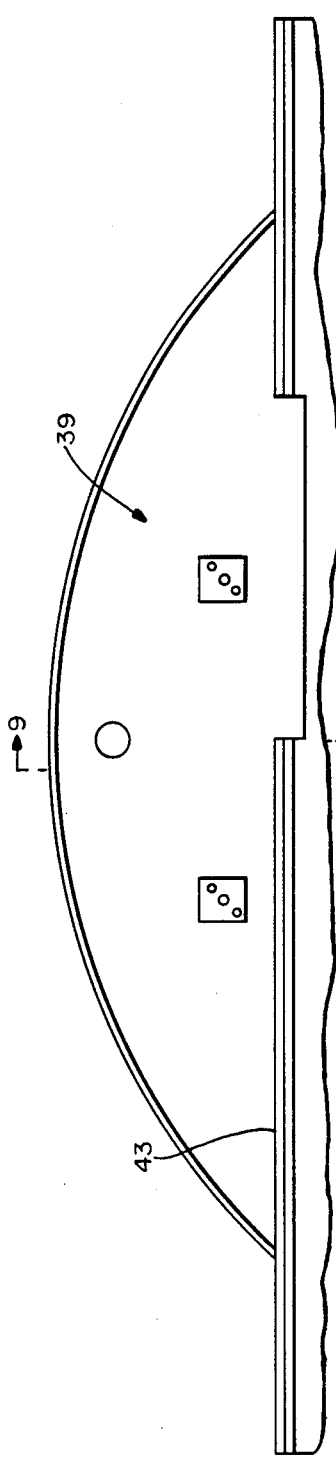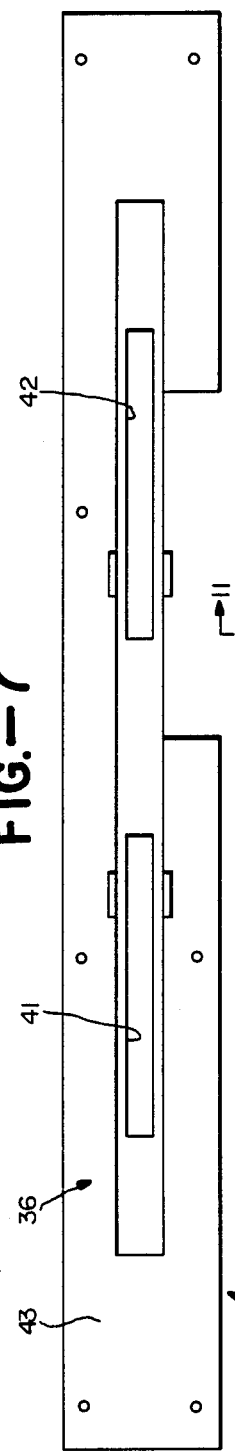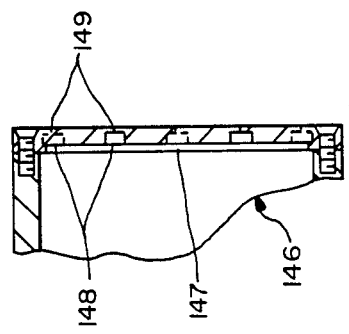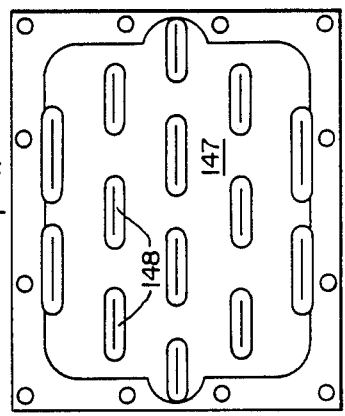

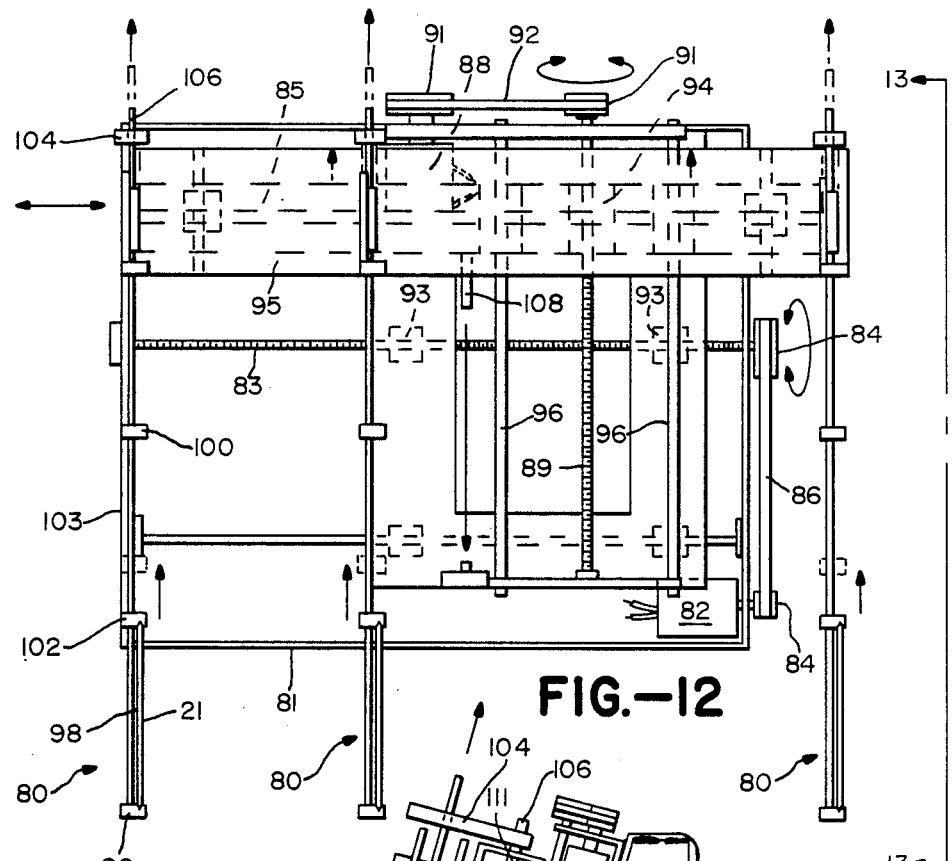
FIG.—12
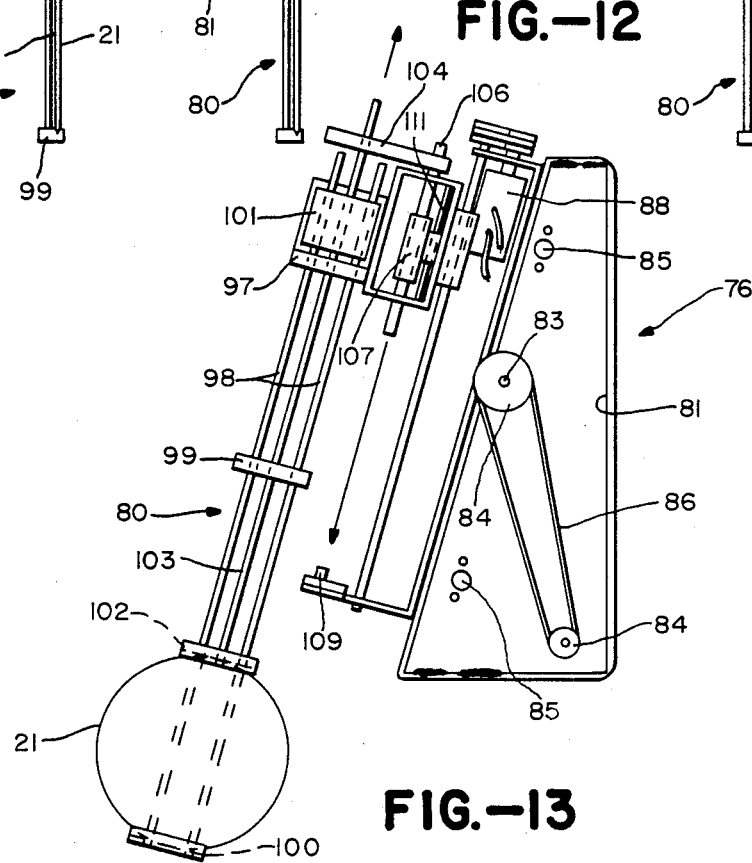
FIG.—13

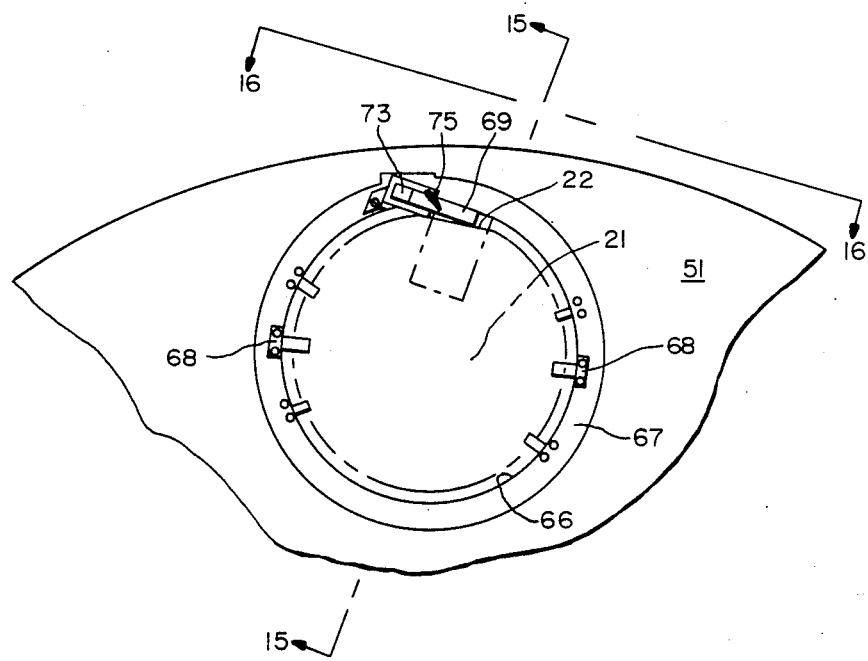
FIG.—14
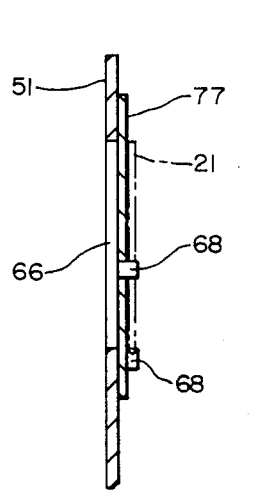
FIG.—15
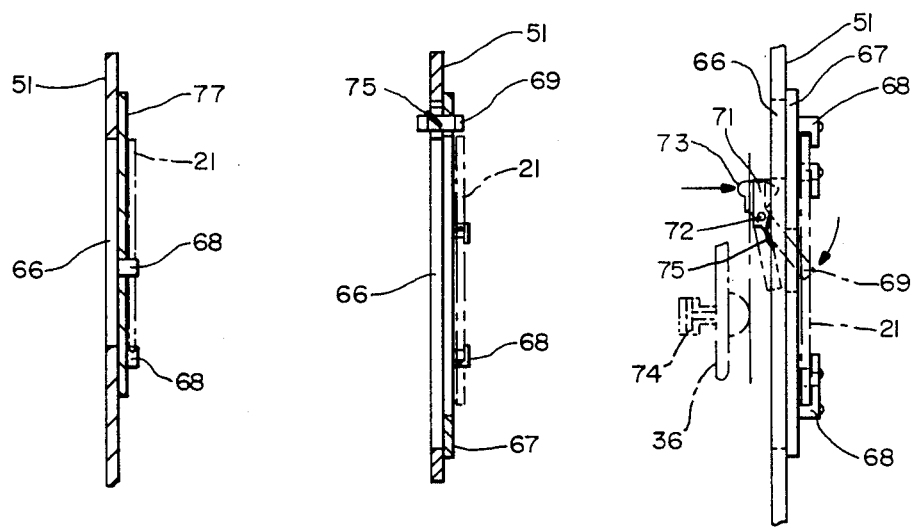
FIG.—15A    FIG.—16

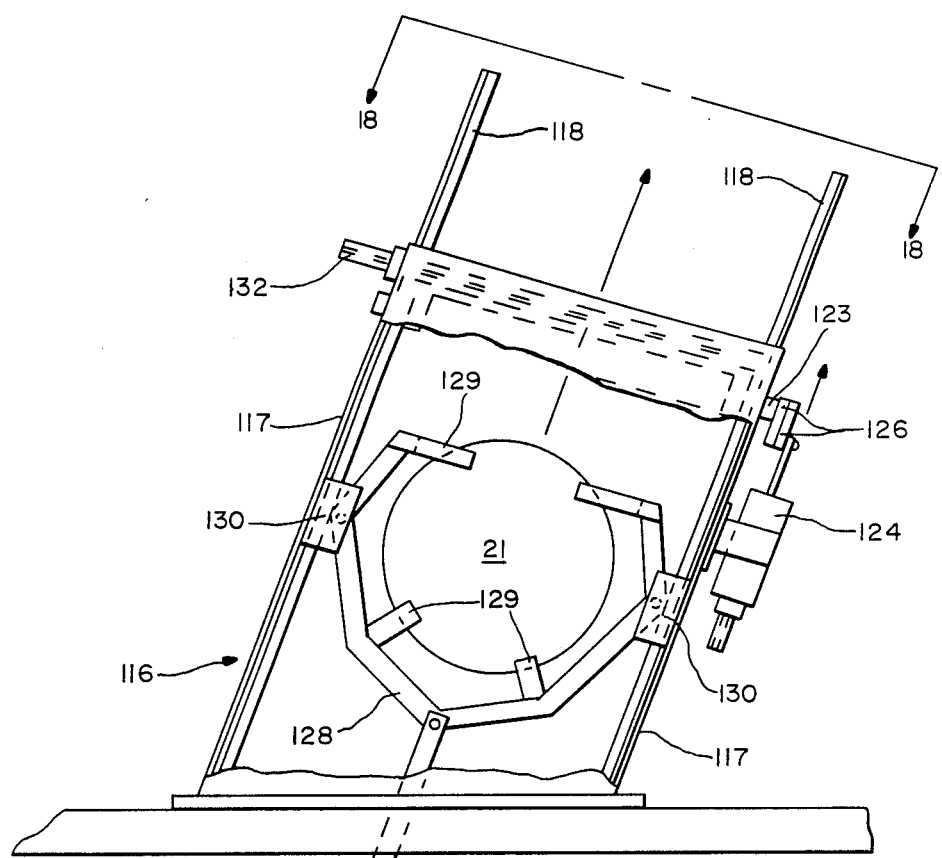
FIG.—17
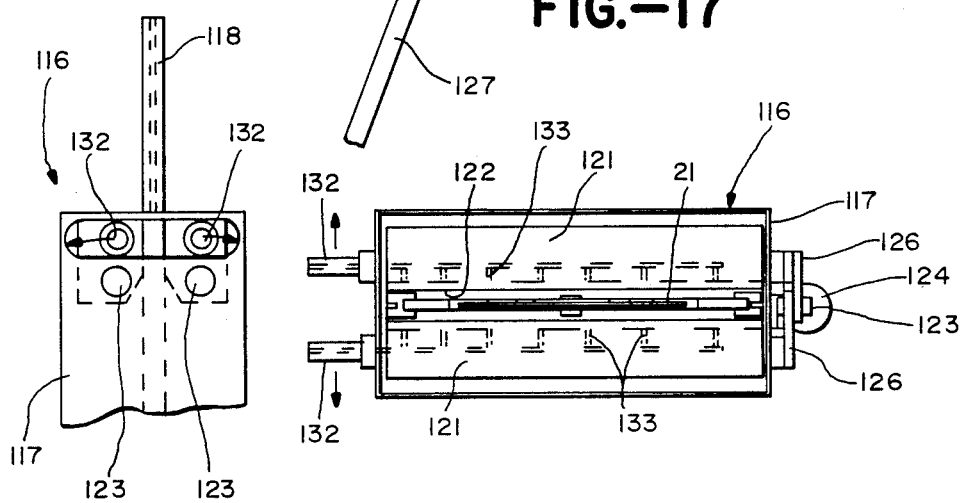
FIG.—19  FIG.—18

WAFER TRANSFER APPARATUS

CROSS-REFERENCE TO RELATED APPLICATION

Reference is made to a companion application of applicants entitled MACHINE FOR STRIPPING WAFERS, Ser. No. 07/150,669, Filed Feb. 1, 1988, which shows a machine for stripping photoresist from wafers. It will be understood that the present invention has application to other uses.

BACKGROUND OF THE INVENTION

1. Field of the Invention

This invention relates to a new and improved apparatus for transferring wafers from one station to another in a wafer treating apparatus such as a machine for stripping photoresist from wafers. The apparatus lifts, transfers and lowers wafers from one station to another in a processing machine, such as a machine for stripping photo-resist.

2. Description of Related Art

Heretofore, wafers have been transferred manually or with tweezers, rather than being handled by a mechanism such as set forth in this application for patent.

SUMMARY OF THE INVENTION

A plurality of lift arms in parallel relationship is provided. These lift arms move both vertically and horizontally under control of step-type electric motors. Thus a transversely moving housing is controlled by a first motor and a vertically moving housing is controlled by a second motor. The vertical moving housing has one or more depending lift arms. Each arm at its lower end has a stop on which the lower edge of a wafer may rest. Associated with said stop is a movable gripper which may be lifted to permit the wafer to be inserted therein and then lowered to hold the wafer while it is being transferred from one processing station to another.

Although the invention is described as being used in a photoresist stripping machine, nevertheless it will be understood that the same apparatus may be used in other environments.

Other objects of the present invention will become apparent upon reading the following specification and referring to the accompanying drawings in which similar characters of reference represent corresponding parts in each of the several views.

IN THE DRAWINGS

FIG. 3 is a reduced dimensional view taken substantially along the line 3—3 of FIG. 2, with certain portions of the machine removed for clarity of illustration.

FIG. 4 is an elevational view of one of the turrets of the machine.

FIG. 7 is a side elevational view of the shroud for one of the turret housings.

FIG. 8 is a top plan view thereof.

FIG. 9 is a sectional view taken substantially along the line 9—9 of FIG. 7.

FIG. 10 is a side elevational view of a nozzle used to flush photoresist from the wafers at the conclusion of the soaking operation.

FIG. 11 is a sectional view taken substantially along the line 11—11 of FIG. 10.

FIG. 12 is an enlarged front elevational view of the lifting mechanism for the wafers.

FIG. 13 is an end elevational view of the structure of FIG. 12 as viewed substantially along the line 13—13 of FIG. 12.

FIG. 14 is an enlarged sectional view through a turret pocket, showing means for retaining the wafer within the pocket.

Figure 1:
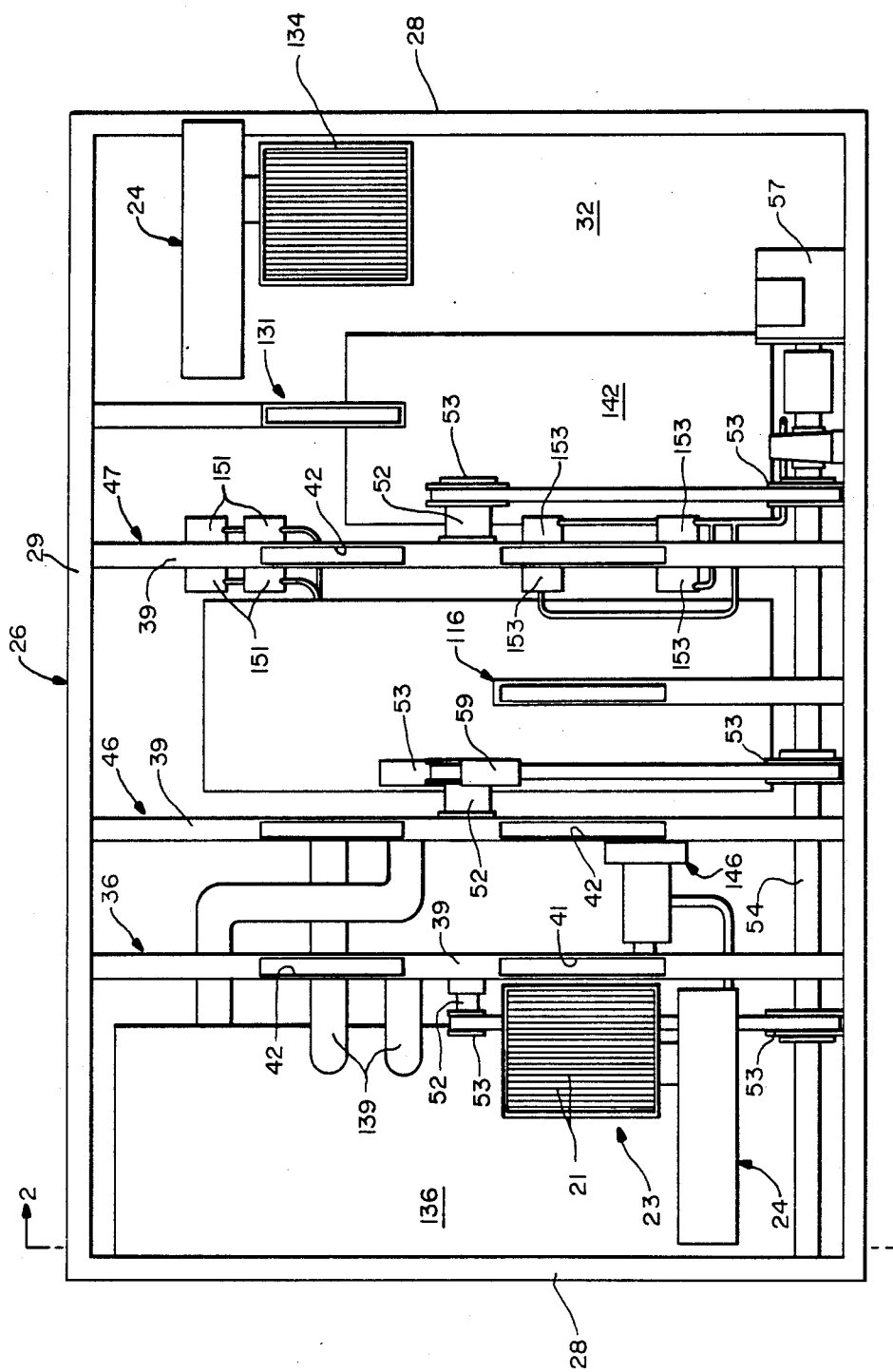
FIG. 1 is a top plan view of the machine with some of the parts on the upper portion thereof removed for clarity of illustration.

FIGS. 15 and 16 are, respectively, views taken substantially along the lines 15—15 and 16—16 of FIG. 14.

FIG. 15A is a view similar to FIG. 15 showing a backing plate for a pocket of a turret used in the second solvent turret.

FIG. 17 is a side elevational view of a pocket in accordance with the present invention partially broken away to reveal internal construction.

FIG. 18 is a view taken substantially along the line 18—18 of FIG. 17.

FIG. 19 is a fragmentary elevational view taken from the left of FIG. 18.

DESCRIPTION OF PREFERRED EMBODIMENTS

Round, thin wafers 21 are used in the manufacture of integrated circuit chips. Such wafers generally have at least one flat edge 22. Cassettes or trays such as input boat 23 are compartmentalized to hold a plurality of such wafers 21. It is assumed that the wafers 21 have been coated with baked photoresist material at the inception of use of this machine. The function of the machine is to remove the photoresist.

Various stripper compounds are commercially available; the present invention will function with substantially any of these compounds. It will be understood that the stripper material is preferably heated to a desired temperature such as 100° C.

A substantially rectangular, elongated frame 26 has bottom 27, end 28 and side 29 members. On the left side as viewed in FIG. 3 is an input shelf 31 upon which an indexer 24 supporting a boat 23 of untreated wafers rests. On the opposite end of the machine is an output shelf 32 in which another indexer 24 and boat 23 are positioned, the latter being filled with wafers one at a time after they have been stripped. Such indexers 24 are commercially available in the semi-conductor industry, a suitable indexer, for example, being Cybco Model 2660 manufactured by Siltec Corporation, Siltec Instrument Division. The function of the indexer 24 is to advance (or retract) boat 23 the distance of one compartment so that individual wafers 21 may be withdrawn for stripping or re-inserted after being stripped by transfer means hereinafter described. Since the indexer is well known in the industry, detailed illustration and description have been considered unnecessary.

Figure 6:
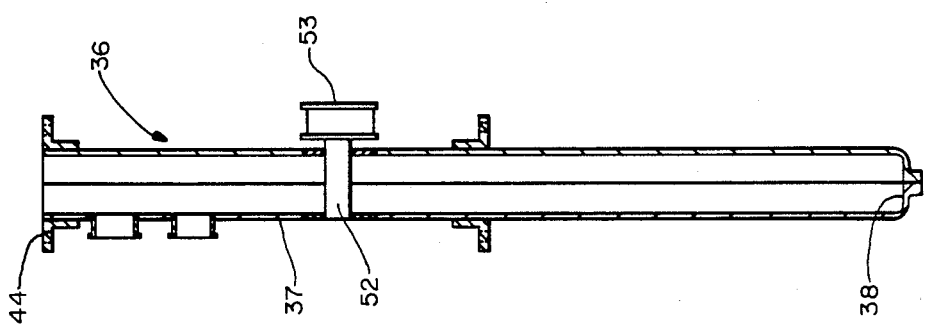
FIG. 6 is a sectional view taken substantially along the line 6—6 of FIG. 5.
Figure 5:
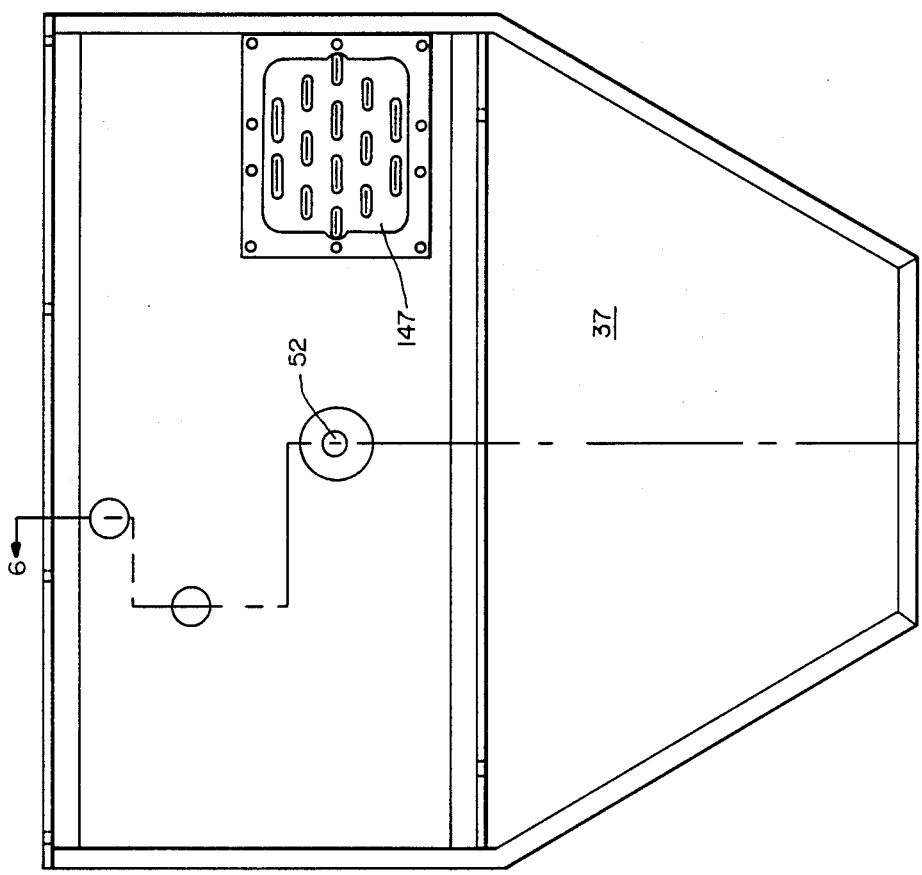
FIG. 5 is a side elevational view of the housing for one of the turrets.

Located within frame 26 is a vertically disposed first turret housing or casing 36 which has sides 37, one of the sides being formed with an inward turned edge 38, which is joined to the opposite side 37, as best shown in FIGS. 5 and 6. The top of housing 36 is open and is provided with a shroud 39 which is segment shaped in side elevation. The lower edge of shroud 39 has a flange 43 which fits on the flange 44 of housing 36 to provide a casing which is closed except for the openings 41, 42. Shroud 39 has a first opening 41 for insertion of wafers and a second opening 42 for removal thereof.

Parallel to housing 36 is a second housing 46 and spaced to the right of housing 46 as viewed in FIG. 1 is third housing 47, both housings 46 and 47 being provided with shrouds 39, similar to that of the first turret housing.

Within each of the housings 36, 46, 47 is a turret 51 which is substantially a stainless steel sheet connected to a shaft segment 52 which extends outside the housing. The shafts 52 are driven through pulleys 53 from a longitudinally extending countershaft 54 driven, in turn, by pulleys 56 from a stepped or intermittent motor 57. The direction of rotation of the turret 51 within housing 46 is opposite that in housings 36 and 47 as is accomplished by use of idler pulley 59. The various belts 61 are shown in the accompanying drawings and are not otherwise separately identified.

Each turret 51 is formed with a plurality of pockets 66 shaped to receive a wafer 21. As best shown in FIGS. 14–16, a rim 67 surrounds the circular opening in the pocket and attached to rim 67 are clips 68 shaped to receive a part of the edge of a wafer when the latter is inserted through an opening 41 or removed through an opening 42. Since it is understood that the turret 51 is intermittently rotated and in a substantial portion of its travel is inverted, a detent 69 is attached to the rim 67 adjacent the periphery of the turret 51, the detent 69 being attached to brackets 71 by a pivot 72. One end of detent 69 is formed with a cam follower 73. As shown in FIG. 16, each housing 36, 46, 47 adjacent openings 41, 42 is provided with a retractable actuator 74 which, on engaging the follower 73, pivots the detent 59 out of operative position against the force of a return spring (not shown) which normally biases the detent into the full line position shown in FIG. 16. One side of turret 51 in housing 46 is closed off by a backing 77 which helps to retain the wafer in place when it is opposite nozzle 146 (see below). In the first and third turrets 36 and 47, the wafers are soaked in solvent or de-ionized water sprayed against both surfaces of the wafer and hence there is no need for backing to the pockets 66 in the particular turrets used in first and third housings 36 and 47.

From the foregoing it will be seen that as the motor 57 turns countershaft 54 one step, the turrets 51 in the housings 36, 47 are turned the space of one pocket 66. In other words, each pocket comes into registry with the opening 41 for insertion of a wafer, is then intermittently revolved downward in its respective housing, being immersed in stripper solution and then is brought up to the discharge opening 42 and removed. The stripper solution is stored in a sump 136 inside frame 26 and is drawn out of the sump by a stripper pump 137 and pumped by tube 144 to the casing 46. Overflow pipes 138 extend from the upper portions of the housings 36 and 46 back to sump 136. There are also returns 139 which circulate stripper solution to casing 36. An overflow 139 extends from the top of casing 46 to the bottom of casing 36. Heater 141 heats the material in the sump 136 to approximately 100° C.

It is desirable that any photoresist which remains on the surface of the wafer be flushed off, and for such purpose there is mounted on one side of housing 46 adjacent the discharge end 42 a nozzle 146. The nozzle 146 has a plate 147 facing inward of the housing 46 formed with slots 148. Counterbores 149 are fored on the exterior so that there is a jet action of the stripper against the wafer to flush the photoresist away. Pump 137 pumps stripper into nozzle 146. Because of the force of the nozzle action, it is desirable that there be a backing 77 closing off the pockets 66 in housing 46 and supporting the wafer 21 within the pocket against dislodgment. (See FIG. 15A)

Figure 2:
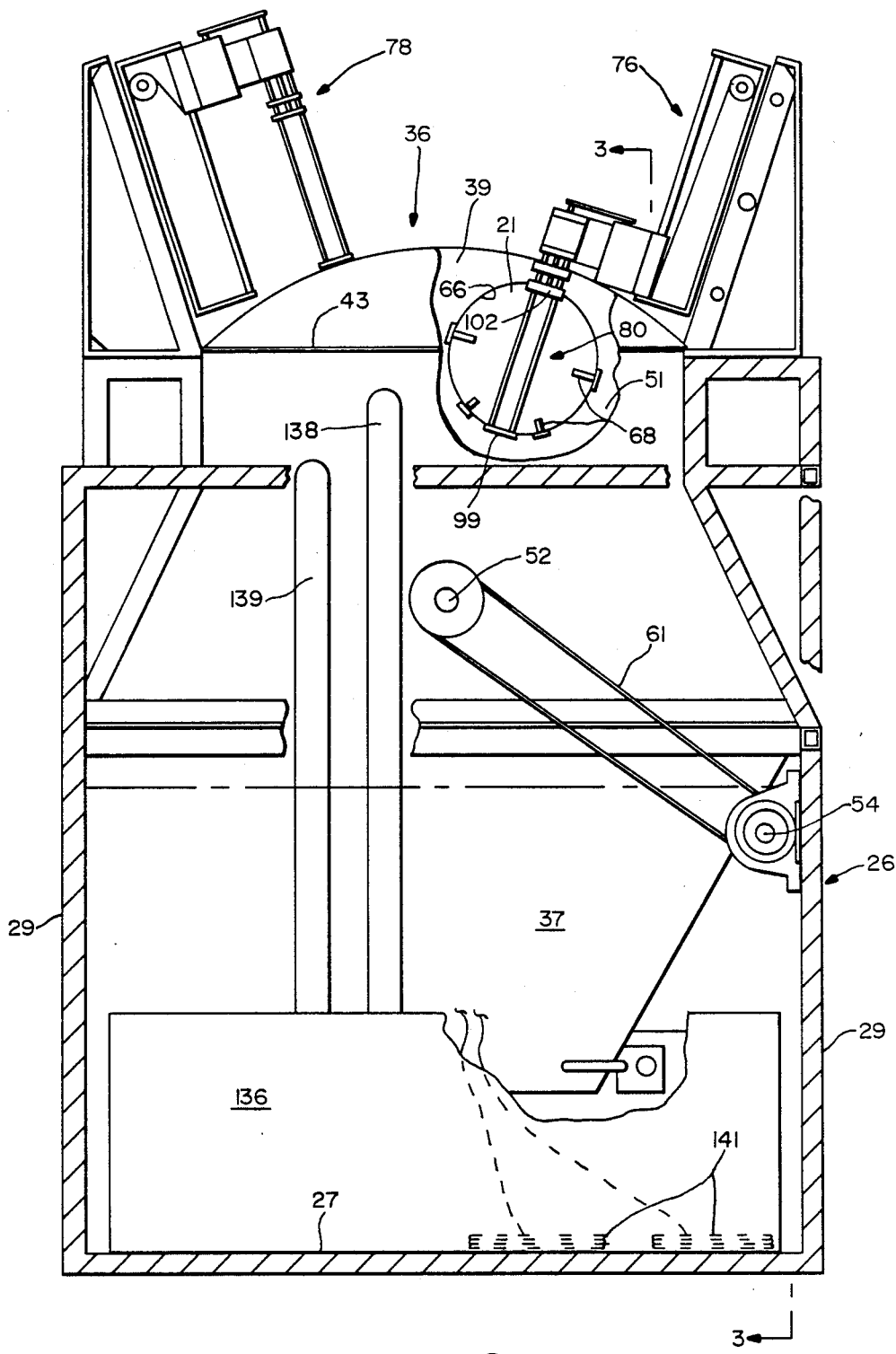
FIG. 2 is a sectional view taken substantially along the line 2—2 of FIG. 1.

A preferred form of transfer device is shown in FIGS. 2, 12, and 13. There is front transfer device 76 along one longitudinal edge of the machine and a rear transfer device 78 on the back of the machine. Other than the spacing between the arms which hold the wafers, the transfer devices 76 and 78 are substantially identical and hence only one such device need be illustrated and described in detail. Thus, as viewed in FIG. 13, there is a base housing 81 which is trapezoidal in shape, one end of the trapezoid resting upon an appropriate shelf on the top of the frame 26. Motor 82 drives a horizontal feedscrew 83 by means of pulleys 84 and belt 86. Horizontal guide rods 85 positioned above and below screw 83 are received in linear bearings fixed to transverse housing 87 to guide the transverse housing 87 for horizontal reciprocation, the housing 87 having nut 93 fixed thereto which is in mating engagement with the screw 83.

Transverse housing 87 is provided with a second motor 88 which drives a vertical feedscrew 89 through pulleys 91 and belt 92. Nut 94 is in threaded engagement with the feedscrew 89 and the housing 95. There are vertical guide rods 96 on either side of screw 89 which are received in linear bearings likewise attached to the housing 95. Thus, as the motors 82 and 88 are energized, they cause the transverse housing 87 to reciprocate horizontally and the housing 95 to reciprocate vertically.

Extending outward from housing 95 are arms 97 which clamp rods 98, the rods being slanted downward-inward so they are at the same angle with respect to the vertical as opening 41 or 42 relative to the axis of shaft 52. Likewise fixed to rods 98 are top guide 99 and bottom stop 100, best shown in FIG. 13. Clamp 101 fixes the upper ends of rods 98 to the arm 97 fixed to housing 95. Gripper 102 reciprocates along rods 98 from the position shown in FIG. 13 to an upper position wherein the gripper 102 is approximately in contact with the upper guide 99. The rod 103 slides through the upper guide 99 and clamp 101, whereas the guide rods 98 are fixed relative thereto. The upper end of rod 103 is attached to arm 104 to which is also attached the upper end of slide rod 106 which reciprocates in slide guide 107 which has linear bearings which slide on parallel shafts 111 fixed to housing 95. (FIG. 13) Normally, the rods 98 and 103 reciprocate together as the housing 95 reciprocates. However, as best shown in FIG. 13, when the push rod 108 engages the abutment 109, guide 107 slides on shafts 111 moving rods 106, arm 104, rod 103 and gripper 102 upward. The gripper 102 rises from its solid line position, shown in FIG. 13, to an upwardly spaced position (not illustrated), thereby releasing the wafer 21 which is shown clamped between the lower stop 100 and the gripper 102. To facilitate the gripping action, the flat 22 of wafer 21 is downmost.

Thus, in the operation of the transfer device, one particular rod 103 is in registry with the input boat 23. The housing 95 is in down position so that the lower end of rod 108 has contacted abutment 109, causing the rod 103 to be in upward position relative to the rods 98 and the gripper 102 being elevated to provide room from a wafer to be received on the stop 100. As the housing 95 is moved upward, the gripper 102 engages and holds the wafer 21 in position by clamping the same against stop 100. The wafer 21 is then lifted as the housing 95 is lifted by the screw 89. Thereupon the screw 83 moves the wafer one station to the right, as viewed in FIG. 12, until the wafer is in registry with the next turret housing 46.

Pocket 116 is interposed between housings 46 and 47. Said pocket 116 is substantially the same as pocket 131, which is disposed to the right of housing 47 in FIG. 1. Pocket 116 may optionally be supplied with alcohol to remove any stripper material which remains on the wafers transferred from housing 46. It is desirable, however, even though no alcohol is supplied in pocket 116, that the wafers being transferred from housing 46 be deposited in the pocket before being transferred to housing 47 so that the same transfer rod 103 does not move directly from housing 46 to housing 47, thereby contaminating the latter.

Walls 117 provide a rectangular cross-section enclosure in pocket 116. The pockets slant upward-outward at the same angle as rods 98, 103. The top of pocket 116 is closed off by nozzles 121 which are pivoted around pivots 123 and are caused to pivot inward by reason of connection to air cylinder 124 through arms 126.

Within the pocket 116 is a wafer support 128, best shown in FIG. 17, having inward directed clips 129 between which the wafer 21 is received. Support 128 has a downward extending tail 127 which is reciprocated by an air cylinder (not shown), slides 130 connected to support 128 which slides on channel-shaped guides 118 on end walls 117 on opposite sides of the pocket 116 and extending up above the pocket (see FIG. 17). The transfer device 76 or 78 deposits a wafer in support 128 when it is in raised position. Tail 127 is then lowered, lowering the wafer inside pocket 116, nozzles 121 pivotting inward.

De-ionized water or other suitable rinse is pumped by a pump (not shown) into nozzles 151 on opposite sides of the area of third housing 47 to rinse solvent off the wafers where the wafer approaches the end of its travel around housing 47. Excess de-ionized water drains back to pump 142 and is then recirculated by pump 142 to spray nozzles 153. After a wafer is rinsed in housing 47 it is transferred by one of the devices 80 to pocket 131.

In the dryer pocket 131, the inlets 132 are for heated air or nitrogen and the inlets 132 extend across the length of the pocket and have air jets 133 which direct hot air or nitrogen against both surfaces of the wafer 21 to dry the same. In other respects, pocket 131 resembles pocket 116, except that it is oppositely angled.

From the pocket 131 the transfer mechanism transfers the dried wafer to the output boat 134 on the output shelf 32.

OPERATION

At the commencement of operation, a load of wafers 21 in input boat 23 is deposited on the indexer 24 on shelf 31. The forward transfer device 80 (i.e., to the right as viewed in FIG. 2) is actuated. Thus, with the transfer device fully elevated, motor 82 turns screw 83 to move the transverse housing 87 to the right, as viewed in FIG. 12, until the rightmost transfer device 80 is directly above the first wafer 21 in the boat 23. Thereupon the motor 88 turns the screw 89 to lower the first transfer device into the boat so that the bottom stop 100 fits under the wafer 21. As the device 80 lowers, the push rod 108 contacts the stop 109, causing the gripper 102 to remain stationary as stop 100 lowers, permitting the wafer 21 to fit onto the stop 100. Before motor 88 reverses, motor 82 turns screw 83 to move the transverse housing to position gripper 102 and stop 100 over and under the wafer 21, respectively. Motor 88 then reverses, causing the transfer device 80 to be elevated and thereby the gripper 102 engages the top edge of wafer 21 holding it securely in place. After the wafer 21 is fully elevated, motor 82 turns the screw 83 to move the housing 87 one station to the left, as viewed in FIG. 12, until the wafer 21 is directly over the opening 41 in shroud 39 of the first turret housing 36. Thereupon the transfer device 80 is lowered until bottom 108 contacts stop 109, lifting the gripper 102 relative to stop 100 and the wafer 21 is deposited in the appropriate pocket 66 of turret 51, sliding into the clips 68. At this point the detent 69 is in inoperative position because the cam follower 73 is in contact with cam actuator 74. The transverse housing is then moved back to the right a small distance to clear the wafer. The transfer device 80 is then lifted out of the opening 41. Thereupon the motor 57 turns the turret 51 one pocket in radial movement so that the next wafer (which has been advanced one space by indexer 24) may be loaded into the next pocket. Detent 69 is spring-returned to operative position, holding the wafer in its pocket until it approaches opening 42, whereupon a retractable actuator 74 opens the detent. The wafers are carried around immersed in stripper until they reach a position under the opening 42 of the shroud of housing 36. At this point the rear transfer device 80 takes over, enters the opening 42, receives the wafer and lifts the wafer out of the opening 42. Thereupon the rear device motor 82 is energized to move the rear lift arm one station to the opening 41 in the shroud 39 of the second housing 46. The wafer is lowered through the opening 41 and is placed in the appropriate pocket of the turret 51 in housing 46 and the lift arm is removed from housing 46. It will be understood that the turret in the housing 46 turns in a direction opposite that of the turret in housing 36. As the wafer approaches the end of its travel in housing 46, it is flushed of any remaining photoresist by the nozzle 146.

When the wafer is in position under the opening 42 in the shroud of housing 46, a second lift arm of the front set of lift arms is inserted through the opening 42 and lifts the wafer and moves it over to the pocket 116. Pocket 116 may be filled with alcohol to rinse off any remaining stripper or it may be empty. In any event, it is desirable to deposit the wafer in the pocket 116 so that the same lift arm 80 which moves the wafer from housing 46 does not insert the wafer into housing 47.

During the next cycle, the third lift arm of the front set of lift arms raises the wafer out of the pocket 116 and inserts it in the opening 41 of the shroud 39 of the third (rinse) housing 47. The wafer travels around the housing 47, being sprayed with de-ionized water at several positions during its travel and being immersed in DI water substantially continuously. When it reaches the opening 42, the third lift arm of the rear transfer device 80 raises the wafer out of the opening 42 and moves it one station and then lowers it into the pocket 131. In the pocket 131 the wafer is dried by jets of hot air or nitrogen. A final lift arm of the rear transfer device 80 raises the wafer out of the pocket 131 and lowers it into an appropriate slot in the output boat 134 which is resting on indexer 32. Indexer 32 then moves the boat 134 one space.

It will be understood that, although the foregoing operation has been described in tracing the travel of a single wafer through the machine, additional wafers are continually being handled in the same manner, so that at any given time the full capacity of each turret is utilized.

The present invention is useful in stripping or cleaning objects other than wafers, such as hard disks, mask glass, compact disks and other thin objects. As used in the claims, "wafer" is intended to include other generally round, thin flat devices.

What is claimed is:

1. A transfer mechanism for a pluality of thin round wafers comprising a base, a first screw having a first axis mounted for rotation in said base, a first motor for driving said first screw in either direction, a first housing having a first nut mating with said first screw and reciprocable relative to said base along said first axis, a second screw having a second axis perpendicular to said first axis mounted for roatation in said first housing, a second motor for driving said second screw in either direction, a second housing having a second nut mating with said second screw and reciprocable relative to said first housing along said second axis.

at least one lift device fixed to said second housing at its proximal end and having a distal end comprising grip means on said distal end for detachably gripping sequentially each individual wafer for individually moving each said wafer along said second axis and then moving each individual wafer along said first axis, each said lift device comprising a first rod, first clamp means for clamping the proximal end of said first rod relative to said second housing, first guide means fixed to the distal end of said first rod and wafer grip means spaced up from said first guide means, a second rod connected to said wafer grip means and parallel to and slidable relative to said first rod, second guide means for maintaining said rods in parallelism, a third rod fixed for movement with said second rod, third guide means in said second housing for said third rod and a stop on said first housing engageable with said third rod when said second housing approaches its maximum movement along said second axis to move said grip means away from said first guide means to release a wafer.

2. A transfer mechanism according to claim 1 which further comprises a first set of guide rods mounted in said base parallel to said first screw and a first slide guide for each of said first set of guide rods fixed to said first housing, a second set of guide rods mounted in said first housing parallel to said second screw and a second slide guide for each of said second set of guide rods fixed to said second housing.

3. A transfer mechanism for a plurality of thin round wafers comprising a base, a first screw having a first axis mounted for rotaiton in said base, a first motor for driving said first screw in either direction, a first housing having a first nut mating with said first screw and reciprocable relative to said base along said first axis, a second screw having a second axis perpendicular to said first axis mounted for rotation in said first housing, a second motor for driving said second screw in either direction, a second housing having a second nut mating with said second screw and reciprocable relative to said first housing along said second axis, a plurality of lift devices all parallel to each other and each fixed to said second housing at its proximal end and each having a distal end and grip means on said distal end for detachably gripping sequentially, individual wafers for individually moving each said wafer along said second axis and then moving each individual wafer along said first axis, said lift devices being spaced at intervals along said second housing, each said lift device comprising a first rod, clamp means for clamping the proximal end of said first rod relative to said second housing, first guide means fixed to the distal end of said first rod, a wafer gripper spaced up from said first guide means, a second rod connected to said wafer gripper and parallel and slidable relative to said first rod, second guide means for maintaining said first and second rods parallel, a third rod fixed for movement with all said second rods, guide means in said second housing for said third rod, a stop in said first housing engageable with said third rod when said second housing approaches its maximum movement along said second axis to raise all said grippers away from said guides to release wafers.

* * * * *